United States Patent [19]
Jerominek et al.

[11] Patent Number: 6,130,109
[45] Date of Patent: *Oct. 10, 2000

[54] MICROBRIDGE STRUCTURE AND METHOD FOR FORMING A MICROSTRUCTURE SUSPENDED BY A MICRO SUPPORT

[75] Inventors: Hubert Jerominek, Ste-Foy; Martin Renaud, Québec; Nicholas R. Swart, Ancienne-Lorette, all of Canada

[73] Assignee: Institut National D'Optique, Sainte-Foy, Canada

[ * ] Notice: This patent is subject to a terminal disclaimer.

[21] Appl. No.: 08/966,311

[22] Filed: Nov. 7, 1997

Related U.S. Application Data

[62] Division of application No. 08/711,915, Sep. 12, 1996.

[51] Int. Cl.$^7$ .................................................... H01L 21/00
[52] U.S. Cl. ................................................................ 438/53
[58] Field of Search ................................... 438/50, 52, 53

[56] References Cited

U.S. PATENT DOCUMENTS

| | | |
|---|---|---|
| 3,991,460 | 11/1976 | Roberts . |
| 4,574,263 | 3/1986 | Liddiard ..................................... 338/18 |
| 4,894,701 | 1/1990 | Erhardt et al. ............................ 357/30 |
| 4,967,081 | 10/1990 | Quad et al. ........................... 250/338.1 |
| 5,010,251 | 4/1991 | Grinberg et al. ........................ 250/332 |
| 5,017,786 | 5/1991 | Jungkman et al. . |
| 5,021,663 | 6/1991 | Hornbeck ............................... 250/349 |
| 5,030,827 | 7/1991 | Powell ................................ 250/338.1 |
| 5,118,944 | 6/1992 | Mori et al. . |
| 5,122,666 | 6/1992 | Turnbull .............................. 250/338.3 |
| 5,122,669 | 6/1992 | Herring et al. . |
| 5,286,976 | 2/1994 | Cole . |
| 5,288,649 | 2/1994 | Keenan ....................................... 437/3 |
| 5,300,915 | 4/1994 | Higashi et al. ........................... 338/22 |
| 5,367,167 | 11/1994 | Keenan .............................. 250/338.4 |
| 5,369,280 | 11/1994 | Liddiard . |
| 5,397,897 | 3/1995 | Komatsu et al. . |
| 5,399,897 | 3/1995 | Cunningham et al. ................. 257/467 |
| 5,404,125 | 4/1995 | Mori et al. ................................ 338/18 |
| 5,438,200 | 8/1995 | Thornton . |
| 5,446,284 | 8/1995 | Butler et al. ............................ 250/332 |
| 5,450,053 | 9/1995 | Wood . |
| 5,455,421 | 10/1995 | Spears . |
| 5,479,018 | 12/1995 | McKee et al. . |
| 5,831,266 | 11/1998 | Jerominek et al. .................. 250/338.4 |

FOREIGN PATENT DOCUMENTS

| | | |
|---|---|---|
| 0 354 369 | 2/1990 | European Pat. Off. . |
| 6137943 | 5/1994 | Japan . |
| 2198879 | 6/1988 | United Kingdom . |

OTHER PUBLICATIONS

Proceedings of the IEEE International Electron Devices Meeting, Washington DC, Dec. 5–8 1993, pp. 175–177, R.A. Wood, 'High performance infrared thermal imaging with monolithic silicon focal planes operating at room temperture'.

*Primary Examiner*—Brian Dutton
*Attorney, Agent, or Firm*—Merchant & Gould P.C.

[57] ABSTRACT

The microbridge structure comprises a substrate layer provided with two first electrical contacts, a microstructure provided with two second electrical contacts, and a micro support for suspending the microstructure over and at a predetermined distance from the substrate layer. The micro support extends along a vertical axis. The micro support has a central upper cavity extending along the vertical axis within the micro support. The micro support has a lower end connected to the substrate layer and an upper end connected to the microstructure for supporting the microstructure with respect to the substrate layer. The micro support is a multilayer micro support comprising two conductive paths and a layer made of dielectric material. The conductive paths and the layer of the micro support extend from the upper end to the lower end thereof. The two conductive paths connect respectively the two first contacts to the two second contacts. The present invention is also concerned with a method for forming a microstructure suspended by a micro support.

3 Claims, 11 Drawing Sheets

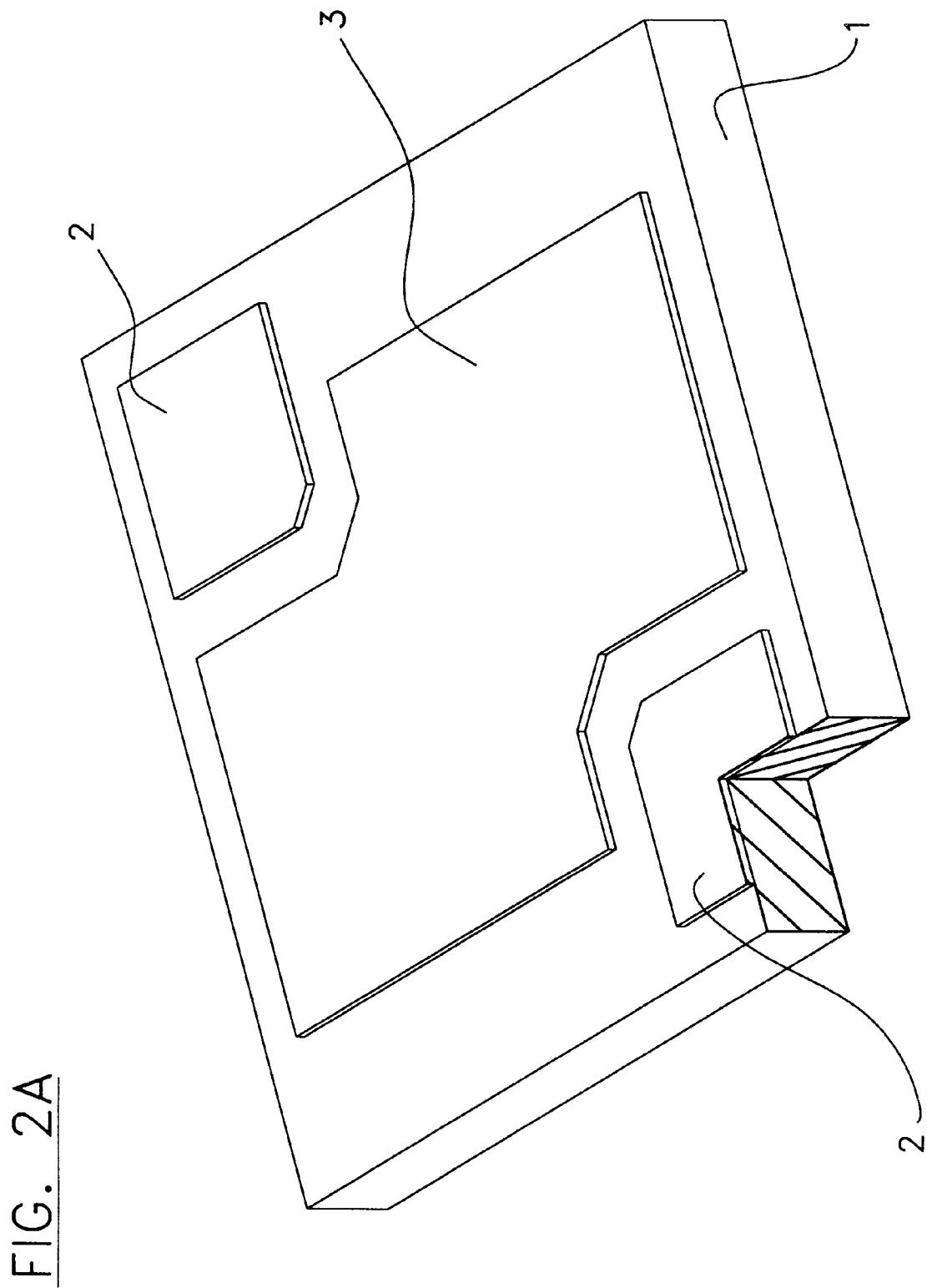

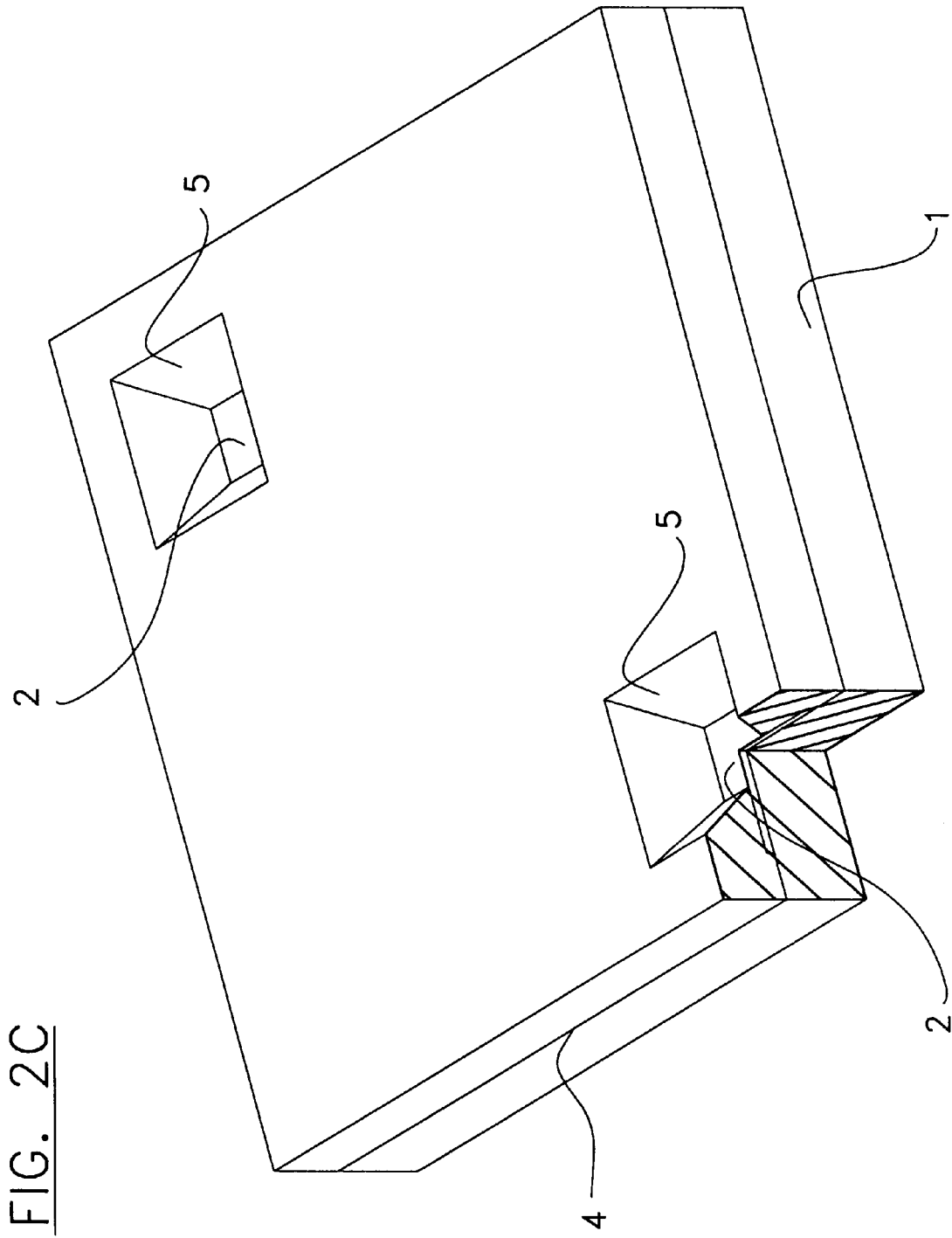

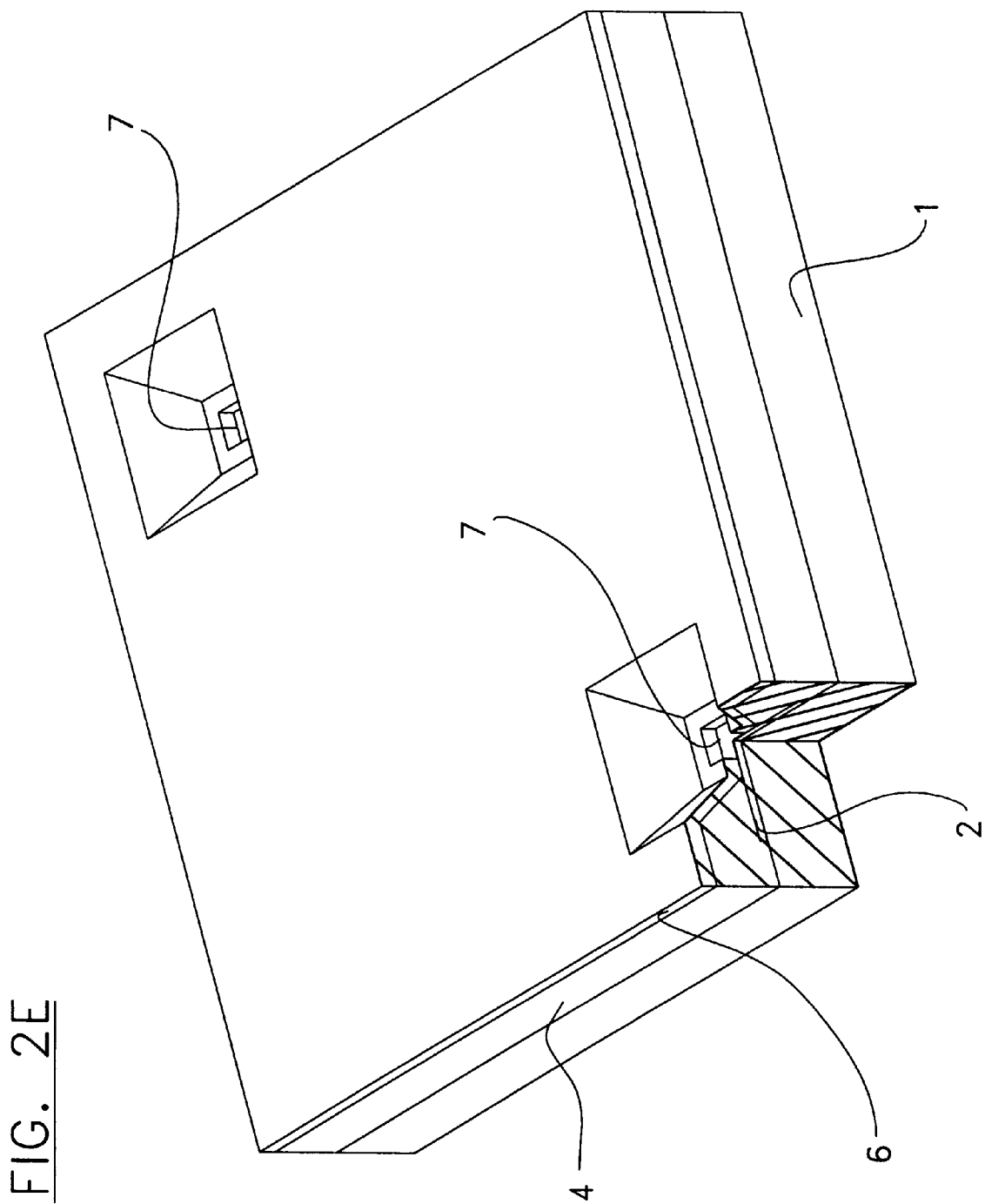

MICROBRIDGE STRUCTURE AND METHOD FOR FORMING A MICROSTRUCTURE SUSPENDED BY A MICRO SUPPORT

This application is a Divisional of application Ser. No. 08/711,915, filed Sep. 12, 1996, which application is incorporated herein by reference.

FIELD OF THE INVENTION

The present invention is concerned with microbridge structure and with a method for forming a microstructure suspended by a micro support.

BACKGROUND OF THE INVENTION

Known in the art, there is the U.S. Pat. No. 5,399,897 assigned to B. T. Cunningham and P. V. Richard, describing a microstructure comprising a surface member and at least one leg, a proximate end of the leg being disposed on a substrate and a distant end being elevated from the substrate and terminating at the surface member. In this microstructure, the legs have a bent section which may be prone to structural damage especially when made of stressed thin films. The structures equipped with the bent legs may also be more prone to shape distortions also caused by the stress in thin films used for this structure construction. Bending of the legs may also cause their disconnection from the substrate.

Also known in the art, there are the U.S. Pat. No. 5,021,663 granted to L. J. Hornbeck and the U.S. Pat. No. 5,288,649 granted to W. F. Keenan. The supports described in these two patents are made entirely of metal or metal alloy films. In these all metal or metal alloy supports, the selected metal or metal alloy must exhibit at the same time proper mechanical properties in order to mechanically support the platform, proper electrical properties in order to reduce the electrical resistance of the connection between the sensor layer placed on the platform and the readout electronic circuit mounted in the typically silicon substrate, and proper chemical properties so that said metal or metal alloy be compatible, i.e. not be damaged, with all the gaseous and liquid chemical products used during the microstructure fabrication process. The combination of all of these properties severely limits the choice of suitable metals or metal alloys and manufacturing processes. Moreover, all metal supports provide a poor thermal isolation of the microplatform due to a relatively high thermal conductivity of metals.

SUMMARY OF THE INVENTION

According to the present invention, there is provided a microbridge structure comprising:

a substrate layer provided with two first electrical contacts;

a microstructure provided with two second electrical contacts;

a micro support for suspending the microstructure over and at a predetermined distance from the substrate layer, the micro support extending along a vertical axis, the micro support having a central upper cavity extending along the vertical axis within the micro support, the micro support having a lower end connected to the substrate layer and an upper end connected to the microstructure for supporting the microstructure with respect to the substrate layer, the micro support being a multilayer micro support comprising two conductive paths and a layer made of dielectric material, the conductive paths and the layer of the micro support extending from the upper end to the lower end thereof, the two conductive paths connecting respectively the two first contacts to the two second contacts.

According to the present invention, there is also provided a method for forming a microstructure suspended by a micro support, the microstructure being for environmental sensing, the method comprising the steps of:

(a) providing a substrate layer with electrical contacts;

(b) covering the substrate layer with a temporary layer;

(c) patterning and etching cavities in the temporary layer to provide accesses to the electrical contacts of the substrate layer, the cavities being also for containing legs of the micro support, each of the cavities extending along a vertical axis, each of the cavities having a lower end opened out onto the electrical contacts of the substrate layer;

(d) covering the layers of previous steps (a) to (c) with a first dielectric layer;

(e) etching the first dielectric layer to provide accesses to the electrical contacts of the substrate layer, the first dielectric layer forming a layer of the legs of the micro support;

(f) covering the layers of previous steps (a) to (e) with a sensing layer;

(g) patterning and etching the sensing layer to define an active area;

(h) covering the layers of previous steps (a) to (g) with an electrically conductive layer, and patterning and etching the electrically conductive layer so that the electrically conductive layer provides two electrical paths from two distal points of the sensing layer to the electrical contacts of the substrate layer, the electrically conductive layer forming a part of the legs of the micro support;

(i) patterning and etching the first dielectric layer down to the temporary layer;

(j) removing the temporary layer to reveal the microstructure which includes a sensing layer and which is suspended by means of the legs of the micro support formed by the first dielectric layer and the electrically conductive layer.

Further objects, advantages and other features of the present invention will become more apparent upon reading of the following non-restrictive description of preferred embodiments thereof given for the purpose of exemplification only with reference to the accompanying drawings.

BRIEF DESCRIPTION OF THE DRAWINGS

FIG. 2A is a perspective view of a method step for forming the microbridge structure of FIG. 1, according to the present invention;

FIG. 2C is a perspective view of a method step for forming the microbridge structure of FIG. 1, according to the present invention;

FIG. 2E is a perspective view of a method step for forming the microbridge structure of FIG. 1, according to the present invention;

FIG. 2I is a perspective view of a method step for forming the microbridge structure of FIG. 1, according to the present invention.

DETAILED DESCRIPTION OF THE DRAWINGS

This invention relates generally to microstructures and manufacturing methods of various types of micro sensors for environmental sensing including radiation, temperature, flow, and chemical sensors. In a preferred embodiment, the micro sensor is an uncooled infrared $VO_2$ based bolometric detector and the microstructure is a suspended microstructure with sensing layer such as an embedded $VO_2$ film. Although the given description is basically in terms of an individual microstructure, the invention equally applies to uni- and bi-dimensional multi-element arrays of such microstructures, for example arrays of the bolometric detectors.

The proposed novel microstructure consisting of a planar microplatform and solid supports provides a compact and deformation-free suspension for the bolometer thermistor. Moreover, the planarity of the microplatform being part of the novel structure simplifies the process of shaping this microplatform by standard photolithography combined with etching techniques.

Figure 1:
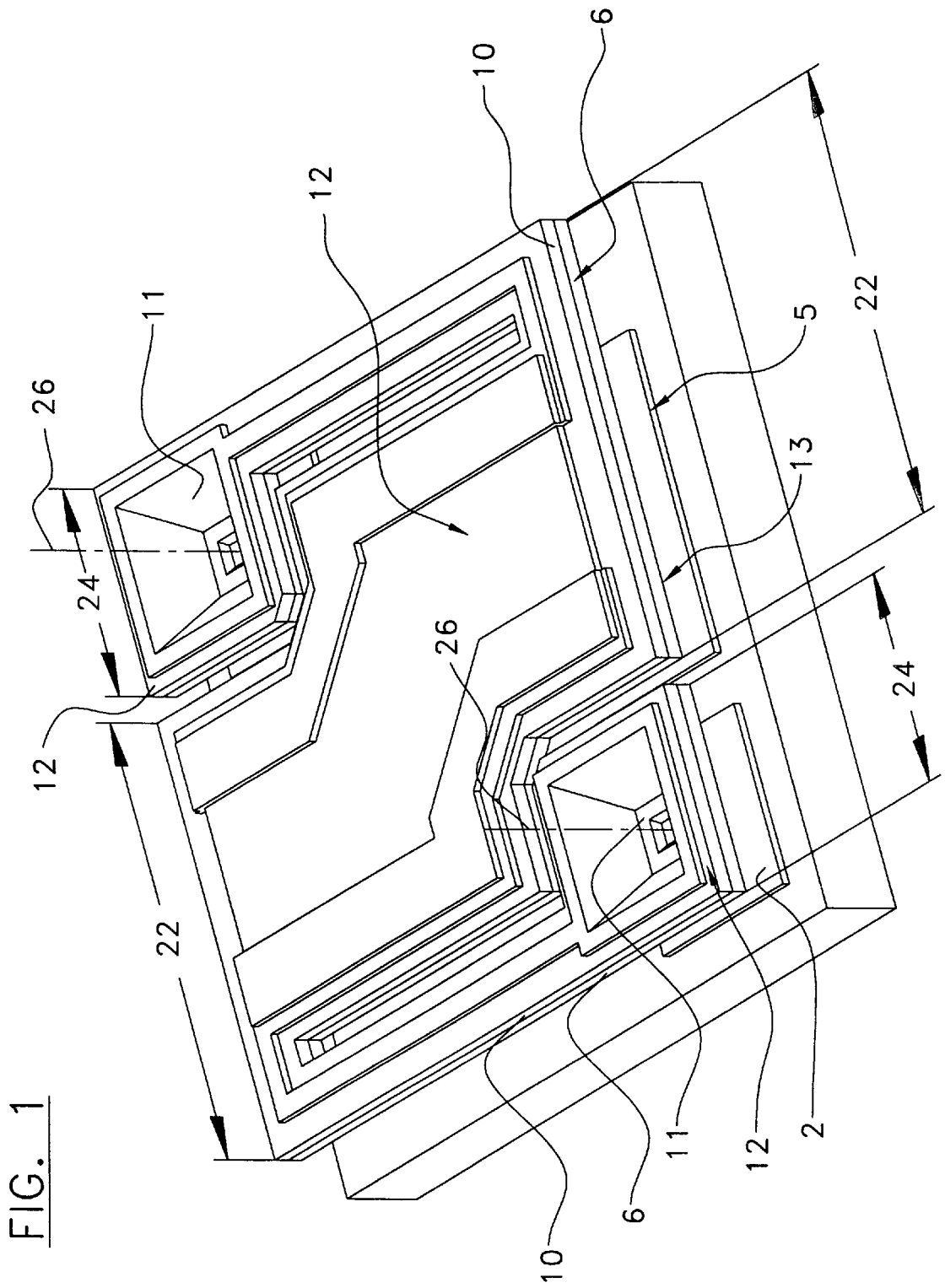
FIG. 1 is a perspective view of a microbridge structure according to the present invention.

Referring now to FIG. 1, there is shown a perspective view of a microbridge structure according to the present invention. The microbridge structure comprises a substrate layer 1 provided with two first electrical contacts 2, a microstructure 22 provided with two second electrical contacts 15 shown in FIG. 2G, and a micro support 24 for suspending the microstructure 22 over and at a predetermined distance from the substrate layer 1.

In a preferred embodiment, the substrate layer 1 is a planar silicon wafer with a bolometer readout circuit (not shown) manufactured using conventional integrated circuit fabrication processing. This substrate layer 1 has metal surface contact pads 2 providing electrical connection between the electronic readout circuit (not shown) and the sensing layer 8 shown in FIG. 2F, which forms a bolometric detector. The microstructure is equipped with slots cut through its entire thickness in order to elongate the path of heat conduction from the microstructure to the micro support, and thus improving thermal isolation of this microstructure.

Preferably, the micro support 24 has two distal legs 11 each extending along a vertical axis 26. Each of the legs 11 has a central upper cavity extending along the vertical axis 26 within the leg 11. Each of the legs 11 has a lower end connected to the substrate layer 1 and an upper end connected to the microstructure 22 for supporting it with respect to the substrate layer 1. Each of the legs 11 is a multilayer leg 11 comprising a first layer made of electrically conductive material 9 shown in FIG. 2G and a second layer made of dielectric material 6.

The first layer 9 of each leg 11 constitutes a conductive path. The conductive path and the second layer 6 made of dielectric material of each leg 11 extend from the upper end thereof to the lower end thereof. The two conductive paths connect respectively the two first contacts 2 to the two second contacts 15 shown in FIG. 2G.

Each of the legs 11 further comprises a third layer 10 made of dielectric material. The third layer 10, in combination with the second layer 6, embeds the first layer 9, except for the lower and upper ends of the leg 11 where openings are provided in the dielectric layers 6 and 10 for allowing electrical connections between the first layer 9 and the electrical contacts 2 and 15. The first layer 9 is an inner layer with respect to the second and third layers 6 and 10 which are outer layers.

The two dielectric layers 6 and 10 provide good thermal isolation to the microstructure due to a relatively low thermal conductivity of dielectric materials. These dielectric layers 6 and 10 can be optimized to provide a solid support for the microstructure and to isolate this platform thermally.

They may also be chosen to be optimally compatible with manufacturing methods used. They protect the encapsulated metal layer 9 which provides an electrical contact between the sensor layer 8 and the readout electronic circuit.

Since the dielectric layers 6 and 10 provide sufficient mechanical support to the microstructure, the metal layer 9 can be optimized strictly from electrical and thermal points of view. In overall, due to its specific construction, the present microstructure supports offer potentially better performance and greater design and manufacturing flexibility than the supports of the prior art.

The dielectric material of the second and third layers 6 and 10 of the micro support 24 is made of a material selected from the group consisting of $Si_3N_4$ and $SiO_2$. Each of the outer layers 6 and 10 has a thickness of substantially a fraction of 1 μm to a few μms.

The inner layer 9 is made of a material selected from the group consisting of Al, Au, Ti and V. The inner layer 9 is a patterned metal film having a thickness of substantially 0.1 μm. The predetermined distance between the microstructure 22 and the substrate layer 1 is substantially of 1 to a few μms.

Each of the legs 11 has substantially the shape of an upside down hollow truncated pyramid. Each of the legs 11 has an upper portion made of upper parts of the layers 6, 9 and 10 and shaped as a collar 12 with a width of substantially 1 to 2 μms. The collars are mechanically, thermally and electrically connected to the microstructure 22. At the bottom of the legs 11, there are vias etched through the dielectric layer 6 down to the electrical contacts 2 on the surface of the substrate layer 1. The conductive layer 9 passes through the vias thus providing electrical connection between the sensing layer 8 and the electrical contacts 2 on the substrate layer 1. The electrical paths formed on the internal walls of the legs 11 descend into the vias.

The two legs 11 support diagonal opposite corners of the microstructure 22. The microstructure 22 has an underside 13, a top side 14 opposite to the underside 13, and at least one sensing layer 8, shown in FIG. 2F, lying between the underside 13 and the top side 14. The sensing layer 8 shown in FIG. 2F is responsive to temperature changes caused by absorbed infrared radiations.

The microstructure 22 further comprises upper and lower dielectric layers 6 and 10. The upper dielectric layer 10 lies over the sensing layer 8 shown in FIG. 2F, and the lower dielectric layer 6 lies under the sensing layer 8 shown in FIG. 2F. The lower layer 6, in combination with the upper layer 10, embeds the sensing layer 8 shown on the FIG. 2F. The dielectric layers 6 and 10 of the microstructure 22 are preferably made of a material selected from the group consisting of $Si_3N_4$ and $SiO_2$ and they each has a thickness of substantially 0.1 to a few μms.

Figure 2B:
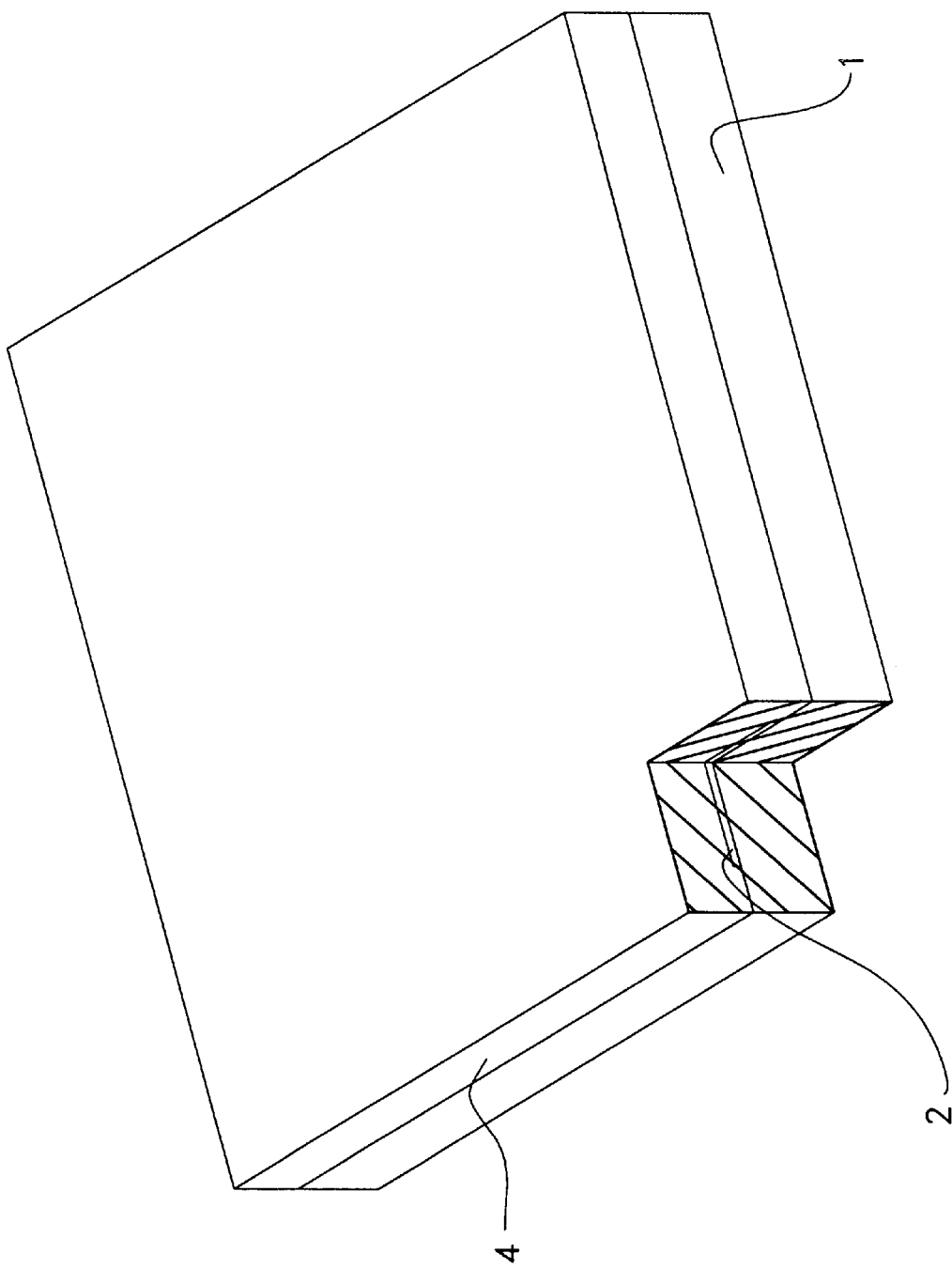
FIG. 2B is a perspective view of a method step for forming the microbridge structure of FIG. 1, according to the present invention.
Figure 2D:
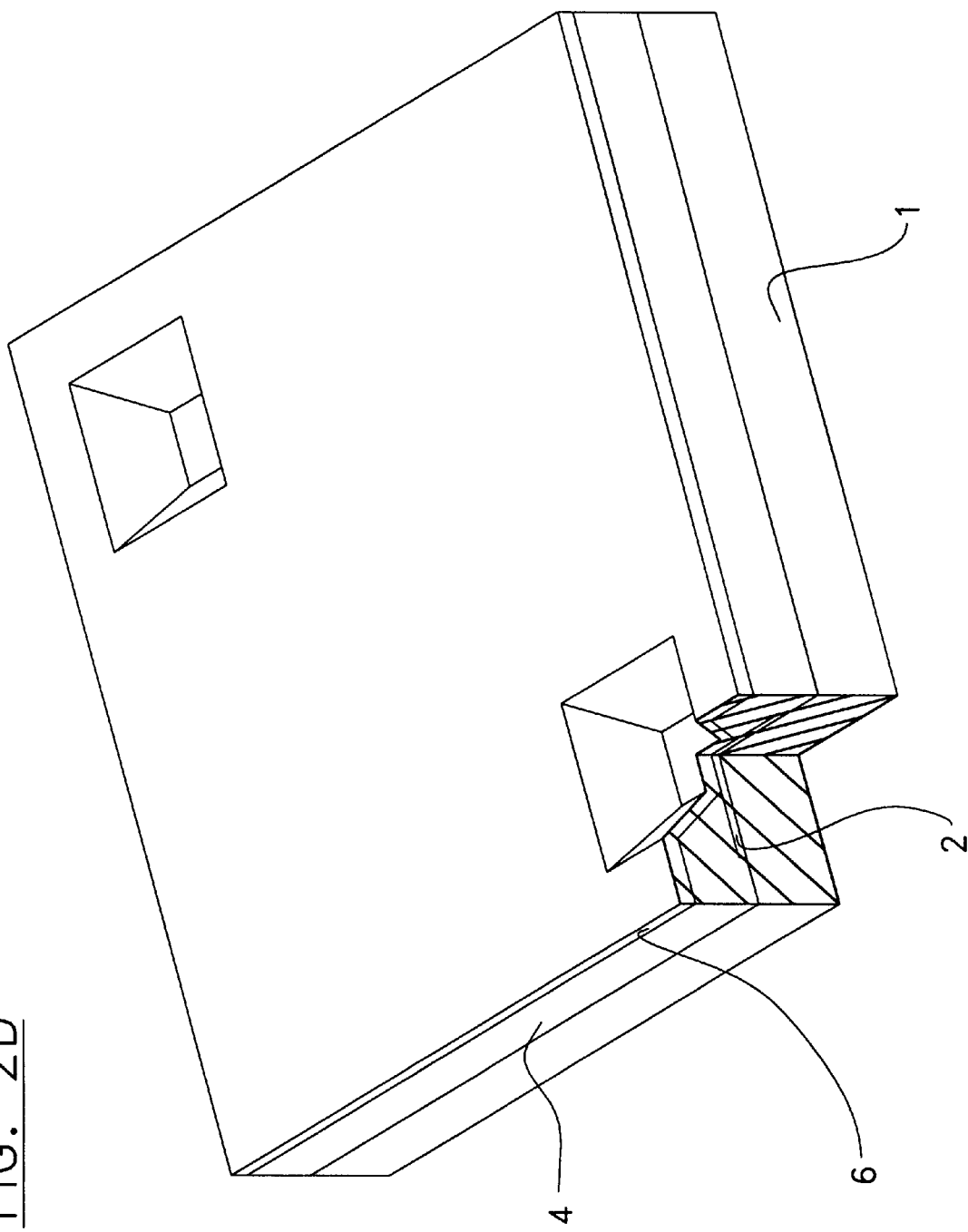
FIG. 2D is a perspective view of a method step for forming the microbridge structure of FIG. 1, according to the present invention.
Figure 2F:
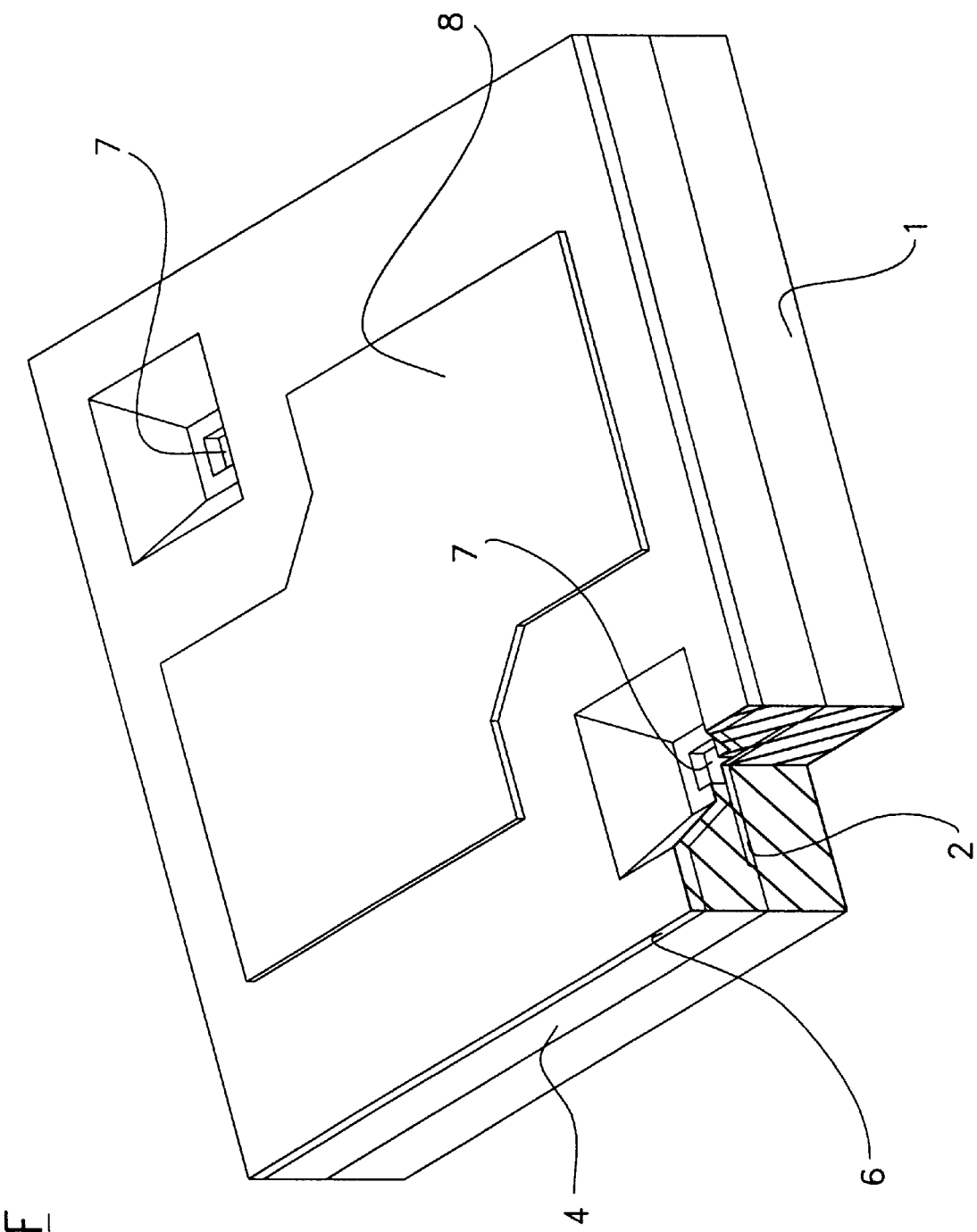
FIG. 2F is a perspective view of a method step for forming the microbridge structure of FIG. 1, according to the present invention.

The sensing layer 8 shown in FIG. 2F is made of a material exhibiting a substantially high temperature coefficient of resistivity. This sensing layer 8 has a thickness of substantially 0.1 to 0.5 μm, and an area of about 50 μm by 50 μm. The material exhibiting a substantially high temperature coefficient of resistivity is selected from the group consisting of $VO_2$, $V_2O_3$ and a-Si, whereby the microbridge structure forms an uncooled infrared bolometric detector.

A thin film infrared reflecting mirror 3 may be located on the substrate layer 1 directly beneath the microstructure 22. This mirror serves to reflect infrared radiation which is not absorbed on its first passage through the uncooled infrared bolometric detector back into the microstructure 22 for additional absorption. The microstructure 22 with the embedded sensing layer which is a $VO_2$ thermistor may be ideally spaced from the mirror 3 by one-quarter of the wavelength of the centre of the infrared spectral band of interest, to gain resonant performance. In more practical cases, however, the spacing may be determined by processing or other concerns.

Referring now to FIGS. 2A to 2J, there are shown the steps of a method for forming a microstructure 22 suspended by a micro support 24 shown in FIG. 1.

The method comprises the steps of (a) providing a substrate layer 1 with electrical contacts 2 as shown in FIG. 2A. Preferably, in the present case a radiation reflecting mirror 3 is also provided. The radiation reflecting mirror 3 has a reflecting surface which faces the underside 13 of the microstructure 22 as can be seen in FIG. 1. The radiation reflective mirror 3 which is an infrared reflecting layer is deposited and then reticulated in order to define the geometrical form of a mirror.

The method further comprises the step of (b) covering the substrate layer 1 with a temporary layer 4 as shown in FIG. 2B. In this step, preferably, a polyimide temporary layer 4 with a thickness of 1 to 3 μm is deposited on the substrate layer 1 equipped with the readout electronics (not shown) and electrical pads by means of a spin coating method. The polyimide temporary layer 4 is subsequently baked to ensure its stability at elevated temperatures. Different materials for the temporary layer 4, such as glass, $SiO_2$ and Si may be used. The temporary layer 4 can be removed by means of an isotropic wet or dry etching which should not cause any damage to microstructure to be built in future steps.

Then, there is a step of (c) patterning and etching cavities 5 in the temporary layer 4 to provide accesses to the electrical contacts 2 of the substrate layer 1. The cavities 5 are also for containing legs 11 of the micro support 24 shown in FIG. 1. Each of the cavities 5 extends along a vertical axis 26 shown in FIG. 1. Each of the cavities 5 has a lower end opened out onto the electrical contacts 2 of the substrate layer 1. The cavities 5 can have perpendicular or sloped walls with proper dimensions and are fabricated in the polyimide sacrificial layer 4 by means of a combination of a standard photolithographic process and a reactive ion etching process known as the RIE process.

Then, there is performed a step of (d) covering the layers of previous steps (a) to (c) with a first dielectric layer 6 as shown on the FIG. 2D. Preferably, the first dielectric layer 6 is deposited by means of a plasma enhanced chemical vapour deposition technique known as the PECVD technique. This first layer 6 will be a part of the microstructure and of the leg of the micro support.

Then, there is a step of (e) etching the first dielectric layer 6 to provide accesses or vias 7 to the electrical contacts 2 of the substrate layer 1 as shown in FIG. 2E. The vias 7 are made by means of the combination of a standard photolithographic process and the RIE process. These vias 7 will enable electrical connection between the sensing layer of the microstructure and the readout electronics of the substrate layer.

Then, there are performed steps of (f) covering the layers of previous steps (a) to (e) with a sensing layer 8, and (g) patterning and etching the sensing layer 8 to define an active area as shown in FIG. 2F. Preferably, the sensing layer 8 is a $VO_2$ layer deposited by means of a reactive sputtering technique, and then reticulated to define the active area by means of the combination of a standard photolithographic process and a RIE process. However, any other material with an appropriate temperature coefficient of resistivity or TCR such as $V_2O_3$ or a-silicon, can be used.

Figure 2G:
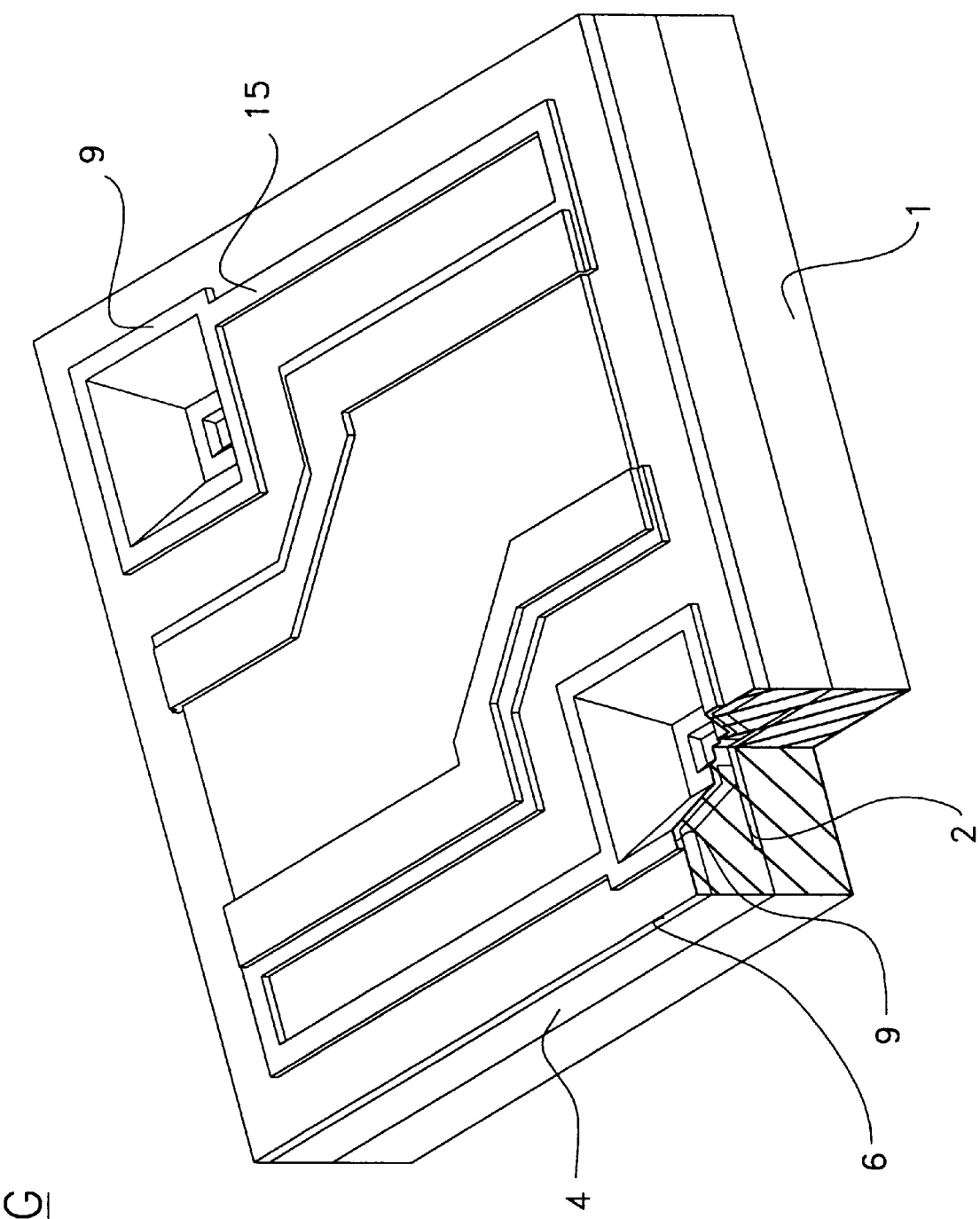
FIG. 2G is a perspective view of a method step for forming the microbridge structure of FIG. 1, according to the present invention.

The next step (h) is a step of covering the layers of previous steps (a) to (g) with an electrically conductive layer 9, and patterning and etching it so that it provides two electrical paths from two distal points of the sensing layer 8 to the electrical contacts 2 of the substrate layer 1 as shown in FIG. 2G. The electrically conductive layer 9 forms a part of the legs 11 of the micro support 24 shown in FIG. 1. The electrically conductive layer 9 is a vacuum deposited metal layer that is patterned and etched by means of a lift-off process or by means of a dry or wet patterning process. Note that steps (f) and (g) can occur after or before step (h).

Figure 2H:
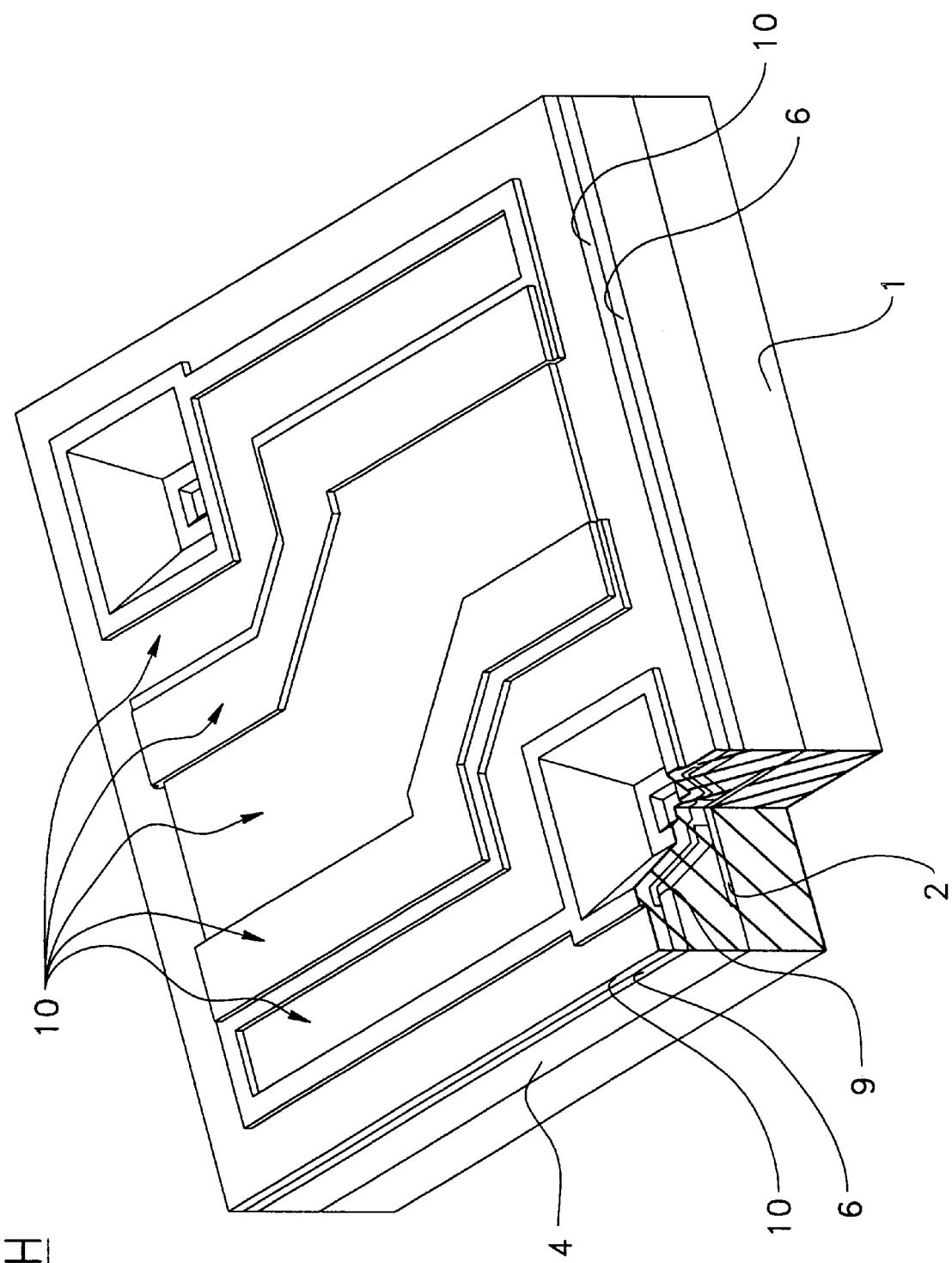
FIG. 2H is a perspective view of a method step for forming the microbridge structure of FIG. 1, according to the present invention.
Figure 21:
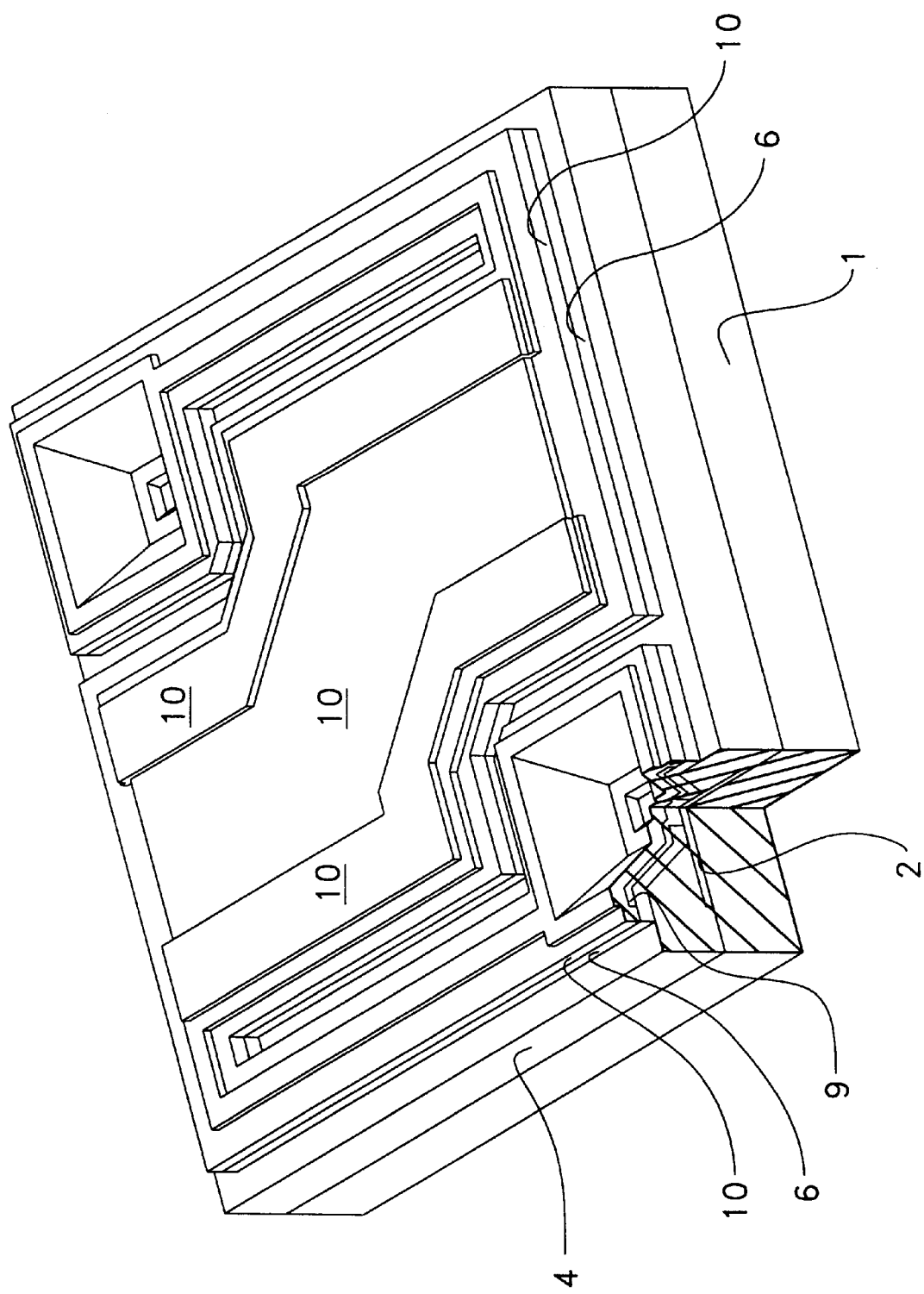
Figure 2J:
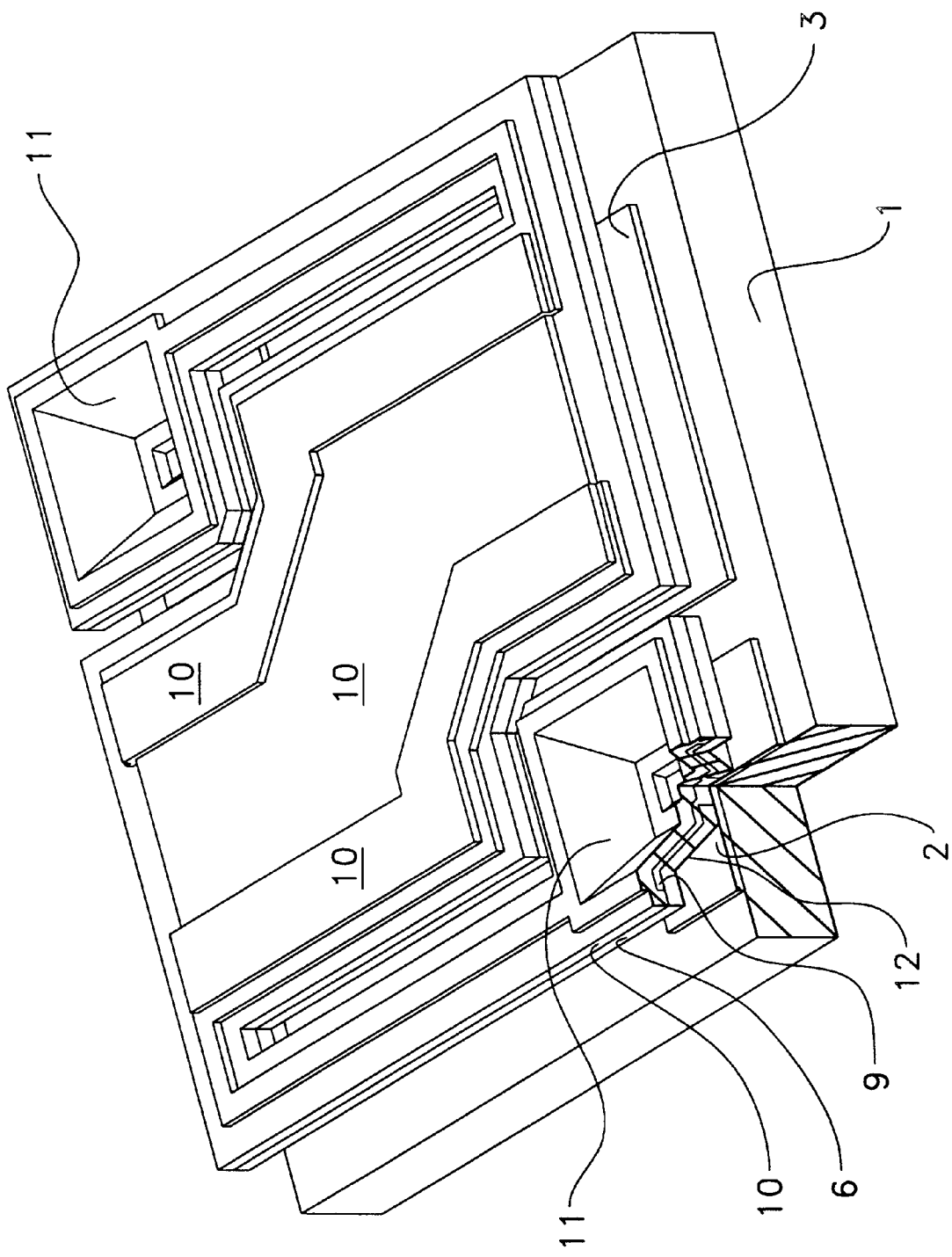
FIG. 2J is a perspective view of a method step for forming the microbridge structure of FIG. 1, according to the present invention.

Preferably, as shown in FIG. 2H, the step (h) further comprises, after the patterning and etching of the electrically conductive layer 9, a step of covering the layers of steps (a) to (h) with a second dielectric layer which, in combination with the first dielectric layer 6, embeds the sensing layer 8 shown in FIG. 2F and the electrically conductive layer 9 except for the accesses 7 provided in step (e). The second dielectric layer 10 is deposited by means of a PECVD technique.

The next step (i) is a step of patterning and etching the first and second dielectric layers 6 and 10 down to the temporary layer 4 as shown in FIG. 2I. Both dielectric layers 6 and 10 are reticulated down to the temporary layer in order to define the geometrical form of the microstructure and its micro support. This is done by combining a standard photolithographic process with a RIE process.

Finally, there is the step of (j) removing the temporary layer 4 to reveal the microstructure which includes a sensing layer and which is suspended by means of the legs 11 of the micro support 24 formed by the dielectric layers 6 and 10 and the electrically conductive layer 9. The temporary polyimide layer 4 is removed by an oxygen plasma process instead of a wet etching process. This offers a significant advantage since the use of a liquid etching solution and subsequently of water for removing of the etching solution can cause problems related to stiction of the microstructure to the substrate layer. This generally causes damage to the suspended microstructure thus reducing overall yield of the fabrication process.

The parameters of the microstructure described herein may be further optimized. For example, the arrangement of some layers in the microstructure may well be revised so that, for a particular application, the fabrication process can be simplified or the performance of the microstructure can be improved. While this invention has been described with reference to illustrative embodiments, this description is not intended to be construed to a limiting sense. Various modifications or combinations of the illustrative embodiments, as well as other embodiments of the invention, will be apparent to persons skilled in the art upon reference to the description. It is therefore intended that the described invention encompasses any such modifications or embodiments.

What is claimed is:

1. A method for forming a microstructure suspended by a micro support, the microstructure being for environmental sensing, the method comprising the steps of:

(a) providing a substrate layer with electrical contacts;

(b) covering the substrate layer with a temporary layer;

(c) patterning and etching cavities in the temporary layer to provide accesses to the electrical contacts of the substrate layer, the cavities being also for containing legs of the micro support, each of the cavities extending along a vertical axis, each of the cavities having a lower end opened out onto the electrical contacts of the substrate layer;

(d) covering the layers of previous steps (a) to (c) with a first dielectric layer;

(e) etching the first dielectric layer to provide accesses to the electrical contacts of the substrate layer, the first dielectric layer forming a layer of the legs of the micro support;

(f) covering the layers of previous steps (a) to (e) with a sensing layer;

(g) patterning and etching the sensing layer to define an active area;

(h) covering the layers of previous steps (a) to (g) with an electrically conductive layer, and patterning and etching the electrically conductive layer so that the electrically conductive layer provides two electrical paths from two distal points of the sensing layer to the electrical contacts of the substrate layer, the electrically conductive layer forming a part of the legs of the micro support;

(i) patterning and etching the first dielectric layer down to the temporary layer;

(j) removing the temporary layer to reveal the microstructure which includes a sensing layer and which is suspended by means of the legs of the micro support formed by the first dielectric layer and the electrically conductive layer.

2. A method according to claim 1, wherein:

the step (h) further comprises, after the patterning and etching of the electrically conductive layer, a step of covering the layers of steps (a) to (h) with a second dielectric layer which, in combination with the first dielectric layer, embeds the sensing layer and the electrically conductive layer except for the accesses provided in step (e); and the step (i) further comprising a step of patterning and etching the second dielectric layer down to the temporary layer.

3. A method according to claim 1, wherein the substrate layer of step (a) is also provided with a radiation reflecting mirror having a reflecting surface facing the sensing layer.

* * * * *